Figure 1:
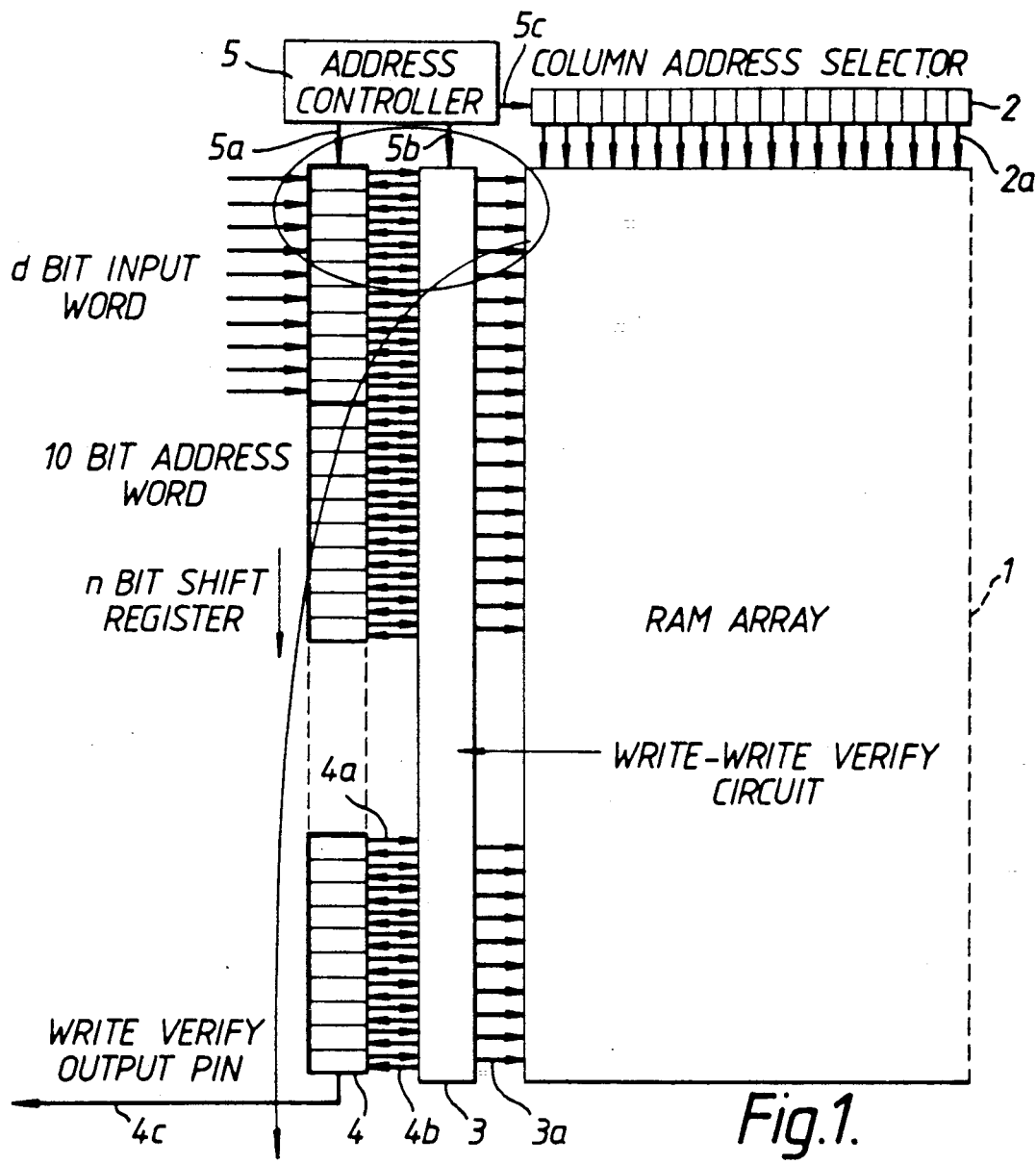

United States Patent [19]

Cliff et al.

[11] Patent Number: 5,046,047

[45] Date of Patent: Sep. 3, 1991

[54] CIRCUIT ARRANGEMENT FOR VERIFYING DATA STORED IN A RANDOM ACCESS MEMORY

[75] Inventors: Richard G. Cliff; Neil S. Hastie, both of Devon, Great Britain

[73] Assignee: Plessey Overseas Limited, Ilford, England

[21] Appl. No.: 473,665

[22] Filed: Feb. 2, 1990

[30] Foreign Application Priority Data

Feb. 10, 1989 [GB] United Kingdom ............... 8902983

[51] Int. Cl.[5] ..................... G11C 19/08; G11C 29/00
[52] U.S. Cl. .................................. 365/201; 371/21.1; 371/21.2
[58] Field of Search ............. 365/201, 189.07, 189.12; 371/21.2, 21.3, 21.1

[56] References Cited

U.S. PATENT DOCUMENTS

| | | | |
|---|---|---|---|
| 3,813,032 | 5/1974 | King | 371/21.3 |
| 4,661,930 | 4/1987 | Tran | 371/21.3 |
| 4,669,061 | 5/1987 | Bhavsar | 365/201 |
| 4,715,034 | 12/1987 | Jacobson | 371/21.2 |
| 4,849,973 | 7/1989 | Kubota | 365/201 |
| 4,926,424 | 5/1990 | Maeno | 371/21.2 |

FOREIGN PATENT DOCUMENTS

| | | | |
|---|---|---|---|
| 14127 | 2/1979 | Japan | 371/21.3 |
| 239698 | 10/1988 | Japan | 371/21.3 |
| 877622 | 11/1981 | U.S.S.R. | 371/21.3 |
| 1244727 | 7/1986 | U.S.S.R. | 371/21.3 |

*Primary Examiner*—Joseph A. Popek
*Assistant Examiner*—Michael A. Whitfield
*Attorney, Agent, or Firm*—Fleit, Jacobson, Cohn, Price, Holman & Stern

[57] ABSTRACT

A circuit arrangement comprising, for each bit location in a column of a RAM, an input shift register, a multiplexer and a comparator. The input data bit is stored in the shift register, and the multiplexer is arranged during a write cycle, to write the data bit into a bit position. During a verification cycle, the multiplexer is arranged to write the inverse data bit into the same position, and the comparator compares the output bit position of the RAM with the inverse data bit. The result is stored in the shift register, which can be down-loaded for analysis.

4 Claims, 1 Drawing Sheet

CIRCUIT ARRANGEMENT FOR VERIFYING DATA STORED IN A RANDOM ACCESS MEMORY

The present invention relates to a circuit arrangement for verifying data stored in a random access memory (RAM).

In standard RAM designs which require verification that the data has been stored correctly, provision is made for reading out the data once the RAM has been written and a comparison is made with the source data. However there are some applications where the data in the RAM may be secret (a military application) or the RAM may be a write only design, which is a well known arrangement wherein the output of the RAM is not read as information but is used as control data for controlling the operation of control circuitry coupled to the output of the RAM. In such applications it is important to test whether the RAM is fully functional or whether the data written to the memory has been corrupted during the write process. In such applications an easy comparison check is impossible.

To overcome this problem, a write verify circuit has been invented.

An object of the present invention is to provide a circuit arrangement which examines each bit of data written into a RAM during a write cycle and which is capable of outputting signals indicative of the examination for further analysis.

According to the present invention, there is provided a circuit arrangement for verifying data stored in a random access memory, the circuit arrangement comprising, for each bit location of a column of the random access memory, an input shift register means arranged to store an input data bit, multiplexer means arranged, during a write cycle, to write the data bit into the bit position in the column of the random access memory, and during a verification cycle, arranged to write an inverse data bit into the data bit position in the column of the random access memory, and a comparator arranged to compare, after completion of the verification cycle, the output of the bit position in the random access memory with the inverse data bit and the result is stored in the input shift register means.

Figure 2:
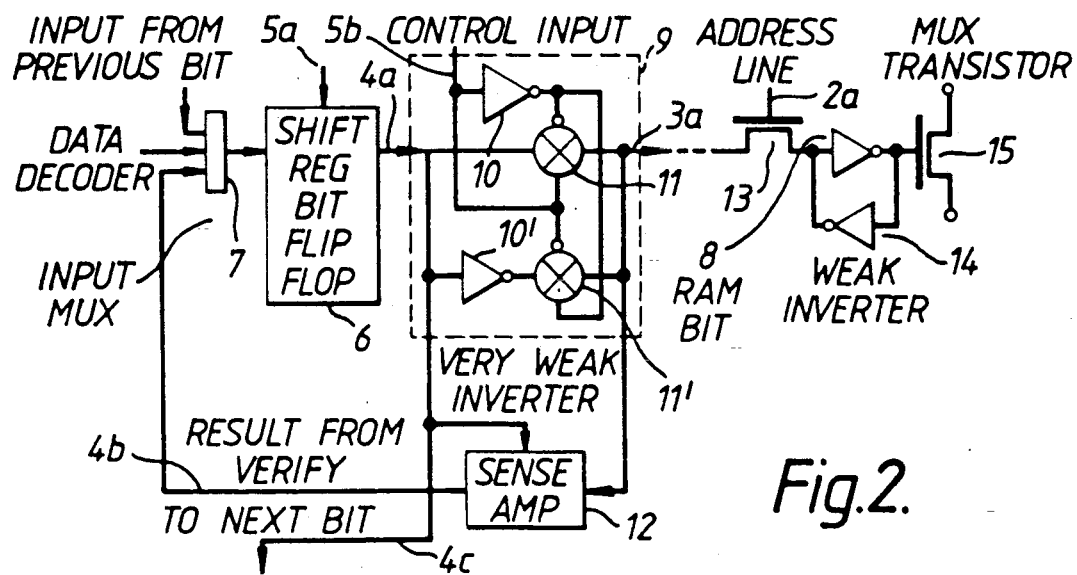

An embodiment of the present invention will now be described with reference to the accompanying drawings wherein;

FIG. 1 shows an example application of the circuit arrangement according to the invention; and, FIG. 2 show the circuit arrangement of the invention.

Referring to FIG. 1, a RAM array 1 is shown, columns of which are addressed by a column address selector 2 by way of address lines 2a. Each bit of a column is addressed by a write-write verify circuit 3 by way of line 3a, which interfaces the RAM array 1 with an n-bit shift register 4 which receives a d bit input word and a 10 bit address word. A whole column of the RAM array is written to at once from the shift register 4 into which the data is loaded a word at a time. The shift-register 4 write-write verify circuit 3 and the column address selector 2, are controlled by an address controller 5, by way of control lines 5a, 5b and 5c respectively. Each bit position of the shift-register 4 is connected to the adjacent bit position by lines 4c. The final bit position providing an output line 4c to a write verify output pin.

Referring to FIG. 2 the circuit arrangement of the present invention will now be described. It should be understood that the circuit shown in FIG. 2 represents the circuit required for one bit position in a column of the RAM array, and in reality a plurality of such circuits would be provided equal in number to the number of bit positions in a column.

The input data bit is stored in a master slave flip-flop 6 which forms part of the shift register 4 (FIG. 1), and is controlled by way of line 5a. The input data bit is presented to the flip-flop 6 by an input multiplexer 7 which also handles an input from the previous bit position and an input from a sense amplifier, to be described later. Multiplexer 7 has a control line (not shown) which switches the output of the multiplexer selectively between the various multiplexer inputs.

Writing to the RAM bit position 8 occurs in two cycles, a write cycle, followed by a verification cycle. The flip-flop 6 has a 2:1 multiplexer 9 connected to its output line 4a. The multiplexer comprises inverters 10, $10^1$, and transmission gates 11, $11^1$ which perform an Exclusive-OR Function. Inverter $10^1$ and transmission gate $11^1$ acts as a very weak inverter circuit, i.e. having high output impedance. The multiplexer 9, therefore switches, the data or the inverse of the data (data bar) onto the line 3a.

During the write phase data is written to the RAM bit by switching the address line 2a of transistor 13, and multiplexer 9. Transistor 13, forms part of the RAM. Each RAM cell also includes a weak inverter 14 and a multiplexer transistor 15. Once this is complete the multiplexer 9 switches over to the data bar output and an attempt to write the data bar signal by way of the very weak inverter is made. The weak inverter $10^1$ is optimised against the feedback element of the RAM bit so that it will NOT overwrite a fully operational RAM cell. A period of time is allowed for the inverter $10^1$ to change the state of a faulty bit and then the output of the RAM is compared with the data signal in flip-flop 6 using a sense amplifier 12 as a comparator. This result is loaded back into the shift register bit via input multiplexer 7. Thus if the output of the flip-flop 6 and RAM bit 8 are the same, i.e. the memory cell is working properly, then the result of the comparison will be positive, and a "1" output signal is written from sense amplifier 12 into flip-flop 6. If however the memory cell is not working properly, the output from sense amplifier 12 will be "0" output signal. The shift register 4 now contains a zero for any location that has failed to write correctly. Thus if any location is stuck at one or zero, the faults can be found by writing all ones and then all zeros and also any disconnected RAM bit can be detected at all times.

Since the RAM can only be tested during a write cycle, the data held within is secure. As the result from the RAM write can be output serially, over line 4c, it can be very easy for the user to locate the faulty RAM cell which is useful for yield analysis and also for fault tolerant type applications.

The circuit-arrangement as described is intended for use with single sided five transistor RAM cells using single address and data lines. However, it will readily be appreciated by those skilled in the art that the circuit could be modified to accommodate six transistor RAM cells.

We claim:

1. A circuit arrangement for verifying data stored in a random access memory comprising, for each bit location of a column of the random access memory, input shift register means arranged to store an input data bit, multiplexer means arranged, during a write cycle, to write the input data bit into a bit position in the column of the random access memory, and during a verification cycle, arranged to write an inverse data bit into the bit position of the input data bit in column of the random access memory, and a comparator arranged to compare, after completion of the verification cycle, an output of the bit position in the random access memory with the inverse data bit and the result is stored in the input shift register means, wherein the multiplexer means comprises first and second transmission gates, wherein the first transmission gate is arranged to pass the input data bit to the bit location of the random access memory during a write cycle, and the second transmission gate in conjunction with an inverter connected to an input of the second transmission gate is arranged to pass the inverse data bit to a bit location of the random access memory during a verification cycle, wherein the inverter and second transmission gate act as a weak inverter circuit, and the weak inverter circuit is arranged so as not to overwrite a fully operational random access memory bit location, and wherein an input multiplexer is connected to an input of the input shift register, and is arranged to receive an input data bit, the result from the comparator and an input from a previous bit location.

2. A circuit arrangement as claimed in claim 1, wherein the comparator is a sense amplifier.

3. A verification circuit for a random access memory for writing data into a memory location and immediately verifying written data, the random access memory comprising:
    a random access memory cell including an input transistor having a first input, first output and a control electrode, an address control line coupled to the control electrode, a first inverter having a second input and second output, a second inverter having a third input coupled to the second output of the first inverter and a third output coupled to the second input of the first inverter and the first input of the input transistor, the second inverter being substantially weaker than the first inverter;
    wherein the verification circuit is connected to the first input of said input transistor, the verification circuit comprising:
      input register means having a fourth input, for receiving an input data bit, and a fourth output;
      a first multiplexer having connected between the fourth output of the input register means and the first input of said input transistor, the multiplexer having first and second paths, the second path including a third inverter for inverting a signal received from the input register means, the third inverter being of comparable strength to the second inverter, and a control means for selecting between the first and second paths; and
      comparison means coupled to the fourth output of the input register means and said random access memory cell for comparing signal values stored therein;
    whereby, in operation, write cycle data is written from said input register means via the first multiplexer path in the random access memory cell, and in a subsequent write verify cycle data is attempted to be written via the second multiplexer path into the memory cell, said comparison means detecting whether the write attempt is successful.

4. A circuit as claimed in claim 3, wherein the comparison means has an output, and a second multiplexer is coupled to receive an input data bit and an output of the comparison means, the second multiplexer having an output coupled to the input of the input register means, whereby in the write verify cycle the output of the comparison means is written into the input register means.

* * * * *